(12) United States Patent
Cheng

(10) Patent No.: US 11,825,757 B2
(45) Date of Patent: Nov. 21, 2023

(54) MEMORY DEVICE HAVING A RING HEATER

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 111 days.

(21) Appl. No.: 17/571,962

(22) Filed: Jan. 10, 2022

(65) Prior Publication Data
US 2022/0131073 A1  Apr. 28, 2022

Related U.S. Application Data

(62) Division of application No. 16/734,719, filed on Jan. 6, 2020, now Pat. No. 11,239,418.

(51) Int. Cl.
*H10N 70/00* (2023.01)
*H10N 70/20* (2023.01)

(52) U.S. Cl.
CPC ....... *H10N 70/8613* (2023.02); *H10N 70/066* (2023.02); *H10N 70/231* (2023.02); *H10N 70/826* (2023.02); *H10N 70/841* (2023.02); *H10N 70/8828* (2023.02)

(58) Field of Classification Search
CPC ............ H01L 45/1286; H01L 45/1683; H01L 45/1253; H01L 45/1233; H01L 45/06; H01L 45/144; H01L 51/56; H01L 51/0011; H01L 51/0014; H01L 51/558; H01L 51/001; H01L 2251/558
See application file for complete search history.

(56) References Cited

U.S. PATENT DOCUMENTS

| | | | |
|---|---|---|---|
| 6,271,084 B1 * | 8/2001 | Tu | H01L 28/60 257/E21.59 |
| 7,196,351 B2 | 3/2007 | Chiang et al. | |
| 7,238,959 B2 | 7/2007 | Chen | |
| 7,906,368 B2 | 3/2011 | Breitwisch et al. | |
| 7,928,421 B2 | 4/2011 | Lung | |
| 8,187,946 B2 * | 5/2012 | Karpov | H10N 70/231 257/3 |
| 8,212,231 B2 | 7/2012 | Chen | |

(Continued)

FOREIGN PATENT DOCUMENTS

DE    102008030419 A1    4/2009

OTHER PUBLICATIONS

Ist of IBM Patents or Patent Applications Treated as Related dated Jan. 10, 2022, 2 pages.

*Primary Examiner* — Caleb E Henry
(74) *Attorney, Agent, or Firm* — Tutunjian & Bitetto, P.C.; Kimberly Zillig

(57) ABSTRACT

A semiconductor device includes a base structure of a memory device including a first electrode, first dielectric material having a non-uniform etch rate disposed on the base structure, a via within the first dielectric material, and a ring heater within the via on the first electrode. The ring heater has a geometry based on a shape of the via that produces a resistance gradient.

19 Claims, 9 Drawing Sheets

(56) References Cited

U.S. PATENT DOCUMENTS

| | | | |
|---|---|---|---|
| 8,305,800 B2* | 11/2012 | Tu | H10N 70/826 257/3 |
| 8,361,833 B2 | 1/2013 | Pio | |
| 8,470,635 B2 | 6/2013 | Cha et al. | |
| 8,962,384 B2* | 2/2015 | Redaelli | H10N 70/231 438/102 |
| 9,548,266 B2* | 1/2017 | Ajuria | H01L 24/02 |
| 9,659,998 B1* | 5/2017 | Lung | H10N 70/021 |
| 9,899,372 B1* | 2/2018 | Bi | H01L 28/82 |
| 10,395,984 B2* | 8/2019 | Backes | H01L 23/528 |
| 10,505,111 B1* | 12/2019 | Ok | H01L 21/7682 |
| 10,510,951 B1* | 12/2019 | Yu | H10N 70/801 |
| 2007/0215852 A1* | 9/2007 | Lung | H10N 70/8413 257/4 |
| 2007/0232015 A1* | 10/2007 | Liu | H10N 70/011 257/E21.589 |
| 2008/0061282 A1* | 3/2008 | Sato | H10N 70/011 438/102 |
| 2008/0116437 A1* | 5/2008 | Oh | H10N 70/8828 257/E47.001 |
| 2008/0197335 A1* | 8/2008 | Yu | H10N 70/8265 438/102 |
| 2008/0280390 A1* | 11/2008 | Kim | H10B 63/30 438/95 |
| 2008/0303014 A1* | 12/2008 | Goux | H10N 70/043 438/102 |
| 2011/0155993 A1* | 6/2011 | Chen | H10N 70/8828 438/102 |
| 2012/0119177 A1* | 5/2012 | Erbetta | H10N 70/231 257/E21.52 |
| 2012/0305872 A1* | 12/2012 | Yoon | H10N 70/882 257/532 |
| 2014/0138604 A1* | 5/2014 | Liu | H10N 70/231 257/4 |
| 2017/0062714 A1* | 3/2017 | Kau | H10N 70/8616 |
| 2019/0189688 A1* | 6/2019 | Lille | H10N 70/826 |
| 2020/0152870 A1* | 5/2020 | Lin | H10N 70/023 |
| 2020/0194670 A1* | 6/2020 | Allegra | H10N 70/841 |
| 2020/0219933 A1* | 7/2020 | Cheng | H10N 70/841 |
| 2021/0098532 A1* | 4/2021 | Wu | H10N 70/826 |

* cited by examiner

MEMORY DEVICE HAVING A RING HEATER

BACKGROUND

The present invention generally relates to semiconductor devices, and more particularly to memory devices and methods of forming the same.

One example of non-volatile memory is phase-change memory (PCM). In PCM, a phase-change material (e.g., chalcogenide glass) is formed between two electrodes and the resistance can reversibly change via a phase-change by exploiting semiconducting properties of the phase-change material. The switching between the two phases can be achieved by applying a current pulse. Information can be stored by setting the phase-change material into one of the two phases: an amorphous phase (high resistance) or a crystalline (low resistance) phase. The amorphous phase can be achieved by heating the phase-change material for a relatively short time and quickly cooling the phase-change material, known as a RESET operation, while the crystalline phase can be achieved by heating the phase-change material for a relatively longer time at a lower temperature. Information can be read by measuring a resistance of the PCM cell, known as a SET operation. PCM technology can be used for, e.g., electronic synapse devices, memristors for neuromorphic or analog computing, and high-density/high-speed non-volatile memory applications.

SUMMARY

In accordance with an embodiment, a method for forming a semiconductor device is provided. The method includes etching first dielectric material having a non-uniform etch rate to form a via. The first dielectric material is formed on a base structure of a memory device. The method further includes forming a ring heater within the via on a first electrode of the base structure. The ring heater has a geometry based on a shape of the via that produces a resistance gradient.

In accordance with another embodiment, a method for forming a semiconductor device is provided. The method includes forming first dielectric material having a non-uniform etch rate on a base structure of a memory device. The base structure includes a first electrode and the first dielectric material including silicon oxynitride. The method further includes etching the first dielectric material to form a via, and forming a ring heater within the via on the first electrode. The ring heater has a geometry based on a shape of the via that produces a resistance gradient. The method further includes forming a phase-change material layer on the ring heater, and forming a second electrode on the phase-change material layer.

In accordance with yet another embodiment, a semiconductor device is provided. The device includes a base structure of a memory device including a first electrode, first dielectric material having a non-uniform etch rate disposed on the base structure, a via within the first dielectric material, and a ring heater within the via on the first electrode. The ring heater has a geometry based on a shape of the via that produces a resistance gradient.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
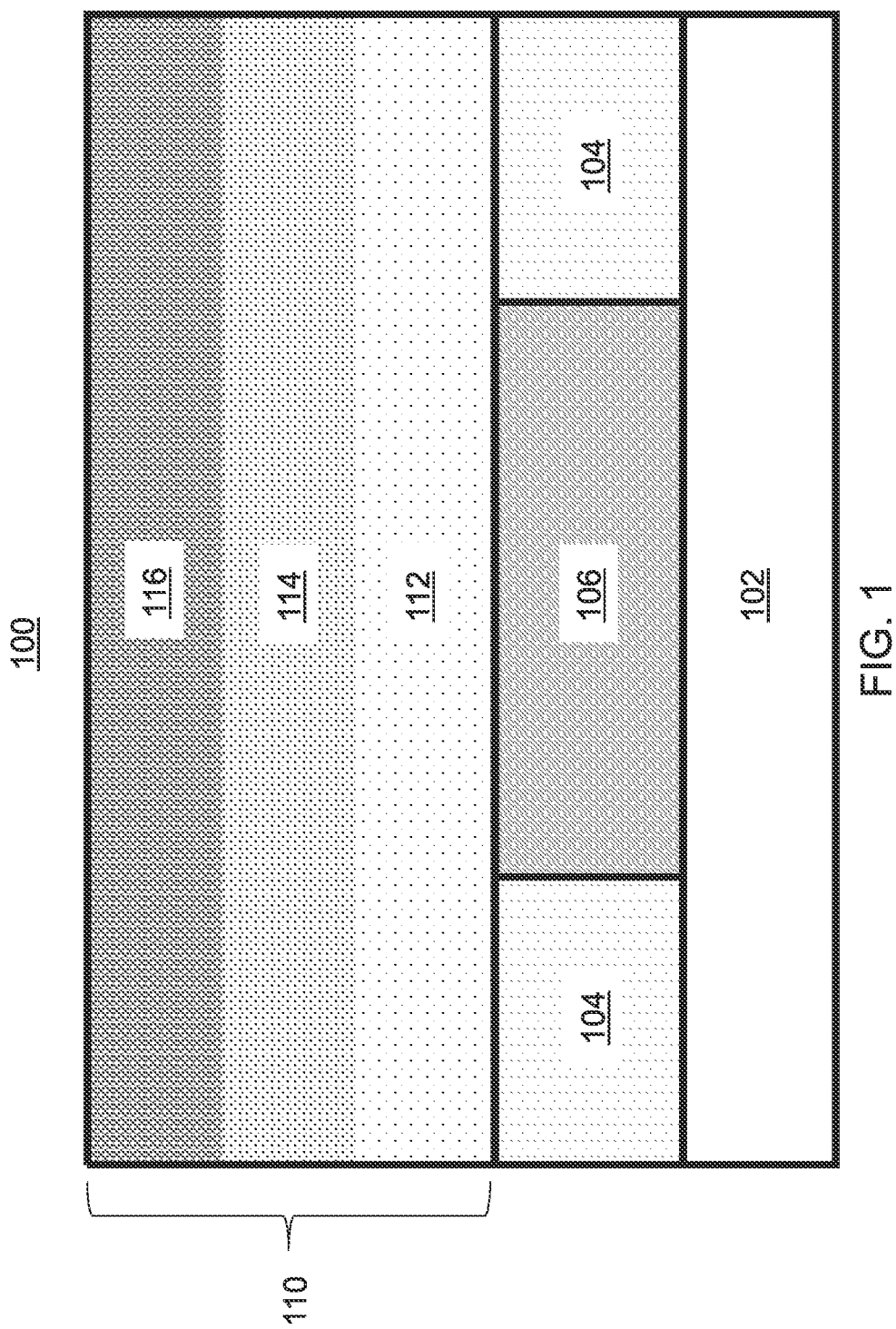
FIG. 1 is a cross-sectional view of the formation of first dielectric material over a base structure of a memory device during the fabrication of a semiconductor device, in accordance with an embodiment of the present invention.

The embodiments described herein provide for semiconductor devices including memory devices having a ring heater. For example, a memory device described herein can be a phase-change memory device including a ring heater placed in proximity to phase-change material. The heater functions to change the phase of the phase-change material (e.g., between amorphous and crystalline phases). The heater material can be optimized separately from the PCM material choice. The resistance of the ring heater can increase gradually and reach a maximum at the top of the ring heater (e.g., contacting the phase-change material). Accordingly, the embodiments described herein can improve memory devices (e.g., PCM devices) by reducing heat loss which wastes programming energy, and reducing programming currents during power-intensive RESET operations.

In one illustrative embodiment, the ring heater can be a cone-shaped ring heater formed on a bottom electrode. In this embodiment, the cone-shaped ring heater can be formed by patterning a cone-shaped via within a first dielectric material. The first dielectric material can have a gradient composition/etch property to support the formation of the cone-shaped via. For example, the first dielectric material can include silicon oxynitride (e.g., SiON) having an N-rich first end (e.g., having properties more like silicon nitride (e.g., SiN) and an O-rich second end (e.g., having properties more like silicon oxide (e.g., SiO$_2$). A conductive heater liner can then be deposited on the sidewall of the cone-shaped via. A remainder of the cone-shaped via can be filled with a second dielectric material. In some embodiments, the second dielectric material pinches off at the top of the cone-shaped via, resulting in an air gap naturally formed in the lower portion of the cone-shaped via. For example, the second dielectric material can include, e.g., silicon nitride deposited by chemical vapor deposition (CVD). In other embodiments, the second dielectric material can fill the remainder of the cone-shape heater via. The air gap, when present, can reduce thermal or heat loss. In an alternative embodiment, the heater material layer can be formed to fill the via without the use of a second dielectric layer. In this embodiment, the heater material layer can pinch off at the top of the via, thereby forming an air gap in the lower portion of the via.

In another illustrative embodiment, the ring heater can be a staircase ring heater formed on a bottom electrode. In this embodiment, a dielectric stack including a plurality of dielectric layers can be formed. For example, the dielectric stack can include a first layer including silicon oxide, a second layer including silicon oxynitride disposed on the first layer, and a third layer including silicon nitride disposed on the second layer. The dielectric stack can be etched (e.g., by reactive-ion etching (RIE)) to form an opening, and a staircase via can be formed by performing an isotropic etch within the opening to widen lower portions of the dielectric stack. A conductive heater liner can then be deposited on the sidewall of the staircase via. A remainder of the staircase via can be filled with a dielectric material. In some embodiments, the dielectric material that fills the remainder of the staircase via pinches off at the top of the staircase via, resulting in an air gap naturally formed in the lower portion of the staircase via. In other embodiments, the dielectric material can fill the remainder of the staircase via. The air gap, when present, can reduce thermal or heat loss.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which can include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes Si$_x$Ge$_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring now to the drawings in which like numerals represent the same or similar elements and initially to FIG. 1, a semiconductor device 100 is shown. The device 100 includes a memory device. In one embodiment, the memory device includes a phase-change memory (PCM) device. However, such an embodiment should not be considered limiting.

As shown, the device 100 includes a substrate 102. The substrate 102 can be a bulk-semiconductor substrate. In one example, the bulk-semiconductor substrate may be a silicon (Si)-containing material. Illustrative examples of Si-containing materials suitable for the bulk-semiconductor substrate include, but are not limited to, Si, SiGe, SiGeC, SiC, polysilicon, epitaxial silicon, amorphous Si, and multilayers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide. The substrate 102 may also be a semiconductor-on-insulator (SOI) substrate. The substrate 102 can include pre-built devices including, but not limited to, transistors (e.g., field-effect transistors (FETs)), isolations, contacts, wirings, etc.

As further shown, the device 100 can further include dielectric layer portions 104 adjacent to a bottom electrode 106 disposed on the substrate 102. The dielectric layer portions 104 can include any suitable material in accordance with the embodiments described herein. For example, the dielectric layer portions 104 can include, e.g., an low-k dielectric material. A low-k dielectric material is a material with a dielectric constant less than the dielectric constant of $SiO_2$ at room temperature (e.g., about 20° C.-25° C.) and atmospheric pressure (e.g., about 1 atm). For example, a low-k dielectric material can have a dielectric constant of less than about 3.9. In one embodiment, the dielectric layer portions can include an ultra-low k (ULK) dielectric material. For example, the dielectric layer portions 104 can include a dielectric material having a dielectric constant, k, less than or equal to, e.g., about 2.5.

The bottom electrode 106 can include any suitable conductive material in accordance with the embodiments described herein. Examples of suitable conductive materials that the bottom electrode 106 can be formed from include, but are not limited to, e.g., tungsten (W), copper (Cu), cobalt (Co), ruthenium (Ru), etc.

The dielectric layer portions 104 can the bottom electrode 106 can be formed on the substrate 102 using any suitable process in accordance with the embodiments described herein. For example, a dielectric layer can be formed on the substrate, the dielectric layer can be etched to form a trench between the dielectric layer portions 104, and conductive material can be formed within the trench to form the bottom electrode 106.

As further shown, the device includes dielectric material 110 formed across the dielectric layer portions 104 and the bottom electrode 106. The dielectric material 110 can have a gradient composition/etch property to support the formation of a truncated-cone-shaped via, referred to herein as a cone-shaped via, as will be described in further detail below. For example, the dielectric material 110 can include silicon oxynitride (e.g., SiON) having a varying oxygen and nitrogen ratio (O:N), such that the dielectric material 110 has an N-rich first end (e.g., having properties more like silicon nitride (e.g., SiN)) and an O-rich second end (e.g., having properties more like silicon oxide (e.g., $SiO_2$)). To illustrate the gradient of the dielectric material 110, gradient layers 112 through 116 are shown. For example, the gradient layer 112 can be N-rich, the gradient layer 114 can be more neutral or balanced, and the gradient layer 116 can be more O-rich. Although the gradient layers 112 through 116 appear discrete for the sake of illustration, it is to be appreciated that the gradient can be a continuous gradient from the first end of the dielectric material 110 to the second end of the dielectric material 110.

Figure 2:
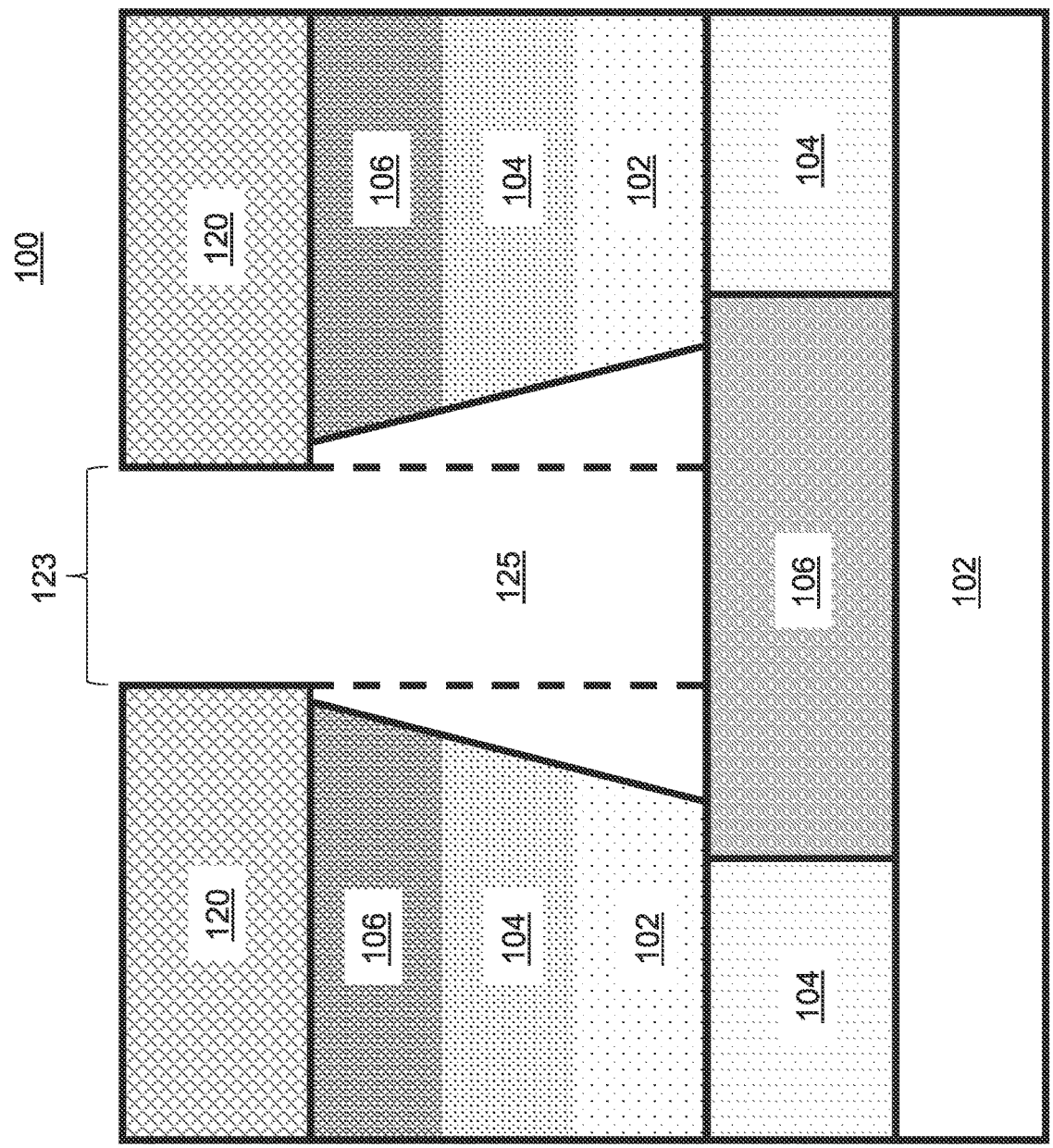
FIG. 2 is a cross-sectional view of the formation of a via within an opening of the first dielectric material during the fabrication of the semiconductor device, in accordance with an embodiment of the present invention.

With reference to FIG. 2, mask layers 120 are formed on the dielectric material 110 for via patterning used to form a via 125. As shown in this illustrative embodiment, the via 125 has a cone shape.

In one embodiment, the via 125 can be formed by employing a first etch process to remove the dielectric material 110 to the bottom electrode 106 (e.g. using reactive-ion etching (RIE) or other suitable dry etch process) to form an opening 123 (indicated by the dashed lines), and then using a second etch process (e.g., an isotropic etch process) within the opening 123 to form a cone shape. More specifically, the cone shape can be formed by exploiting etch rate variations throughout the gradient composition of the dielectric material 110. For example, if the dielectric material 110 includes silicon oxynitride having an O:N gradient, a diluted hydrofluoric acid (DHF) etchant can etch the O-rich portion of the silicon oxynitride faster than the N-rich portion of the silicon oxynitride in order to form the via 125.

In an alternative embodiment, instead of employing a second etch process, the first etch process can be tuned to form the via 125 itself. For example, if the dielectric material 110 includes silicon oxynitride, a silicon oxynitride plasma etch process can be tuned such that it has a more lateral etch component on the N-rich end than on the O-rich end to form the via 125.

Figure 3:
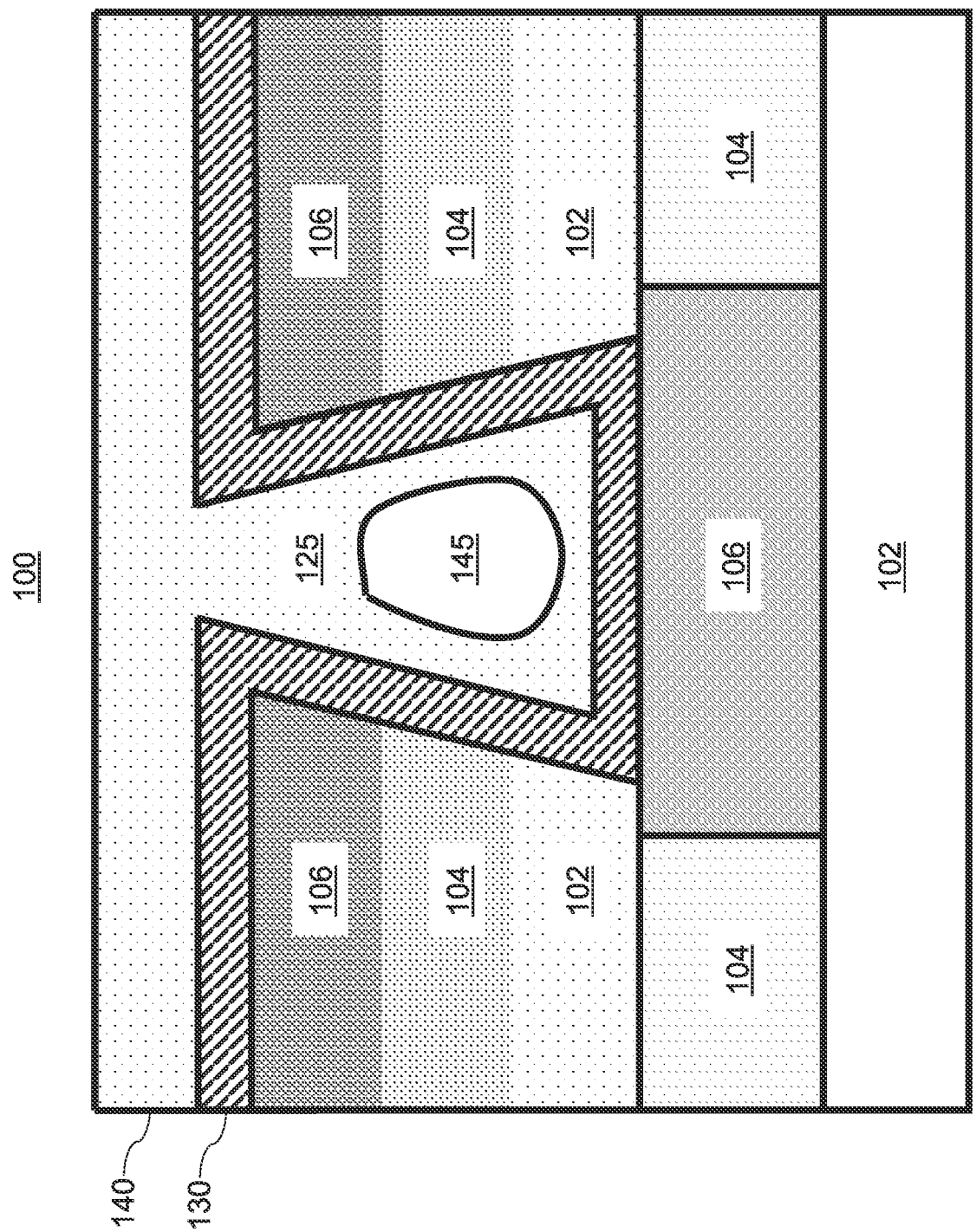
FIG. 3 is a cross-sectional view of the formation of a heater material layer and second dielectric material within the via during the fabrication of the semiconductor device, in accordance with an embodiment of the present invention.

With reference to FIG. 3, the mask layers 120 are removed, a heater material layer 130 is formed within the via.

In one embodiment, and as shown, the heater material layer 130 can be formed by conformally deposited along exposed surfaces of the dielectric material 110 and the bottom electrode 106. Then, a dielectric material 140 is formed on the heater material layer 130 and within the via 125. Any suitable processes can be used to form the heater material layer 130 and the dielectric material 140 in accordance with the embodiments described herein.

In this embodiment, and as further shown, the dielectric material 140 pinches off at the top of the via 125 (e.g., using CVD), thereby naturally forming an air gap 145 in the lower portion of the via 125. The air gap 145 can reduce thermal or heat loss associated with the device 100. For example, the remainder of the via 125 can be completely filled by the dielectric material 140 such as by $SiO_2$ deposited by spin-on-coating, flowable oxide, etc. As another example, the remainder of the via 125 can be filled by deposition of a dielectric, etching back of the deposited dielectric, and deposition of the same or different dielectric. The deposition/etching back can be repeated multiple times (e.g., cyclic processing).

In an alternative embodiment (not shown), the heater material layer 130 can be formed to fill the via 125. In this embodiment, the heater material layer 130 can pinch off at the top of the via 125, thereby forming an air gap in the lower portion of the via 125.

The heater material layer 130 can include any suitable material in accordance with the embodiments described herein. Examples of suitable materials that can be used to form the heater material layer 130 include, but are not limited to, tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), tantalum magnesium carbide (TaMgC), titanium aluminum nitride (TiAlN), hafnium nitride (HfN), hafnium silicon nitride (HfSiN), tantalum silicon nitride (TaSiN), tungsten nitride (WN), molybdenum nitride (MoN), niobium nitride (NbN); titanium carbide (TiC) titanium aluminum carbide (TiAlC), tantalum carbide (TaC), hafnium carbide (HfC), conductive carbon, or any suitable combination of these materials. In some embodiments, a single conductive material can be used. In other embodiments, multiple conductive materials can be used.

The heater material layer 130 can be formed by any suitable process or any suitable combination of multiple processes. Examples of suitable processes that can be used to form the heater material layer 130 include, but are not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc. In one embodiment, the heater material layer 130 can have a thickness ranging from, e.g., about 4 nm to about 30 nm. More specifically, the heater material layer 130 can have a thickness of, e.g., about 6 nm.

The dielectric material 140 can include any suitable material in accordance with the embodiments described herein. Examples of suitable materials that can be used to form the dielectric material 140 include, but are not limited to, silicon nitride (SiN), silicon carbide (SiC), silicon oxynitride (SiON), carbon-doped silicon oxide (SiOC), silicon carbonitride (SiCN), boron nitride (BN), silicon boron nitride (SiBN), silicoboron carbonitride (SiBCN), silicon oxycarbonitride (SiOCN), silicon oxide, etc.

Figure 4:
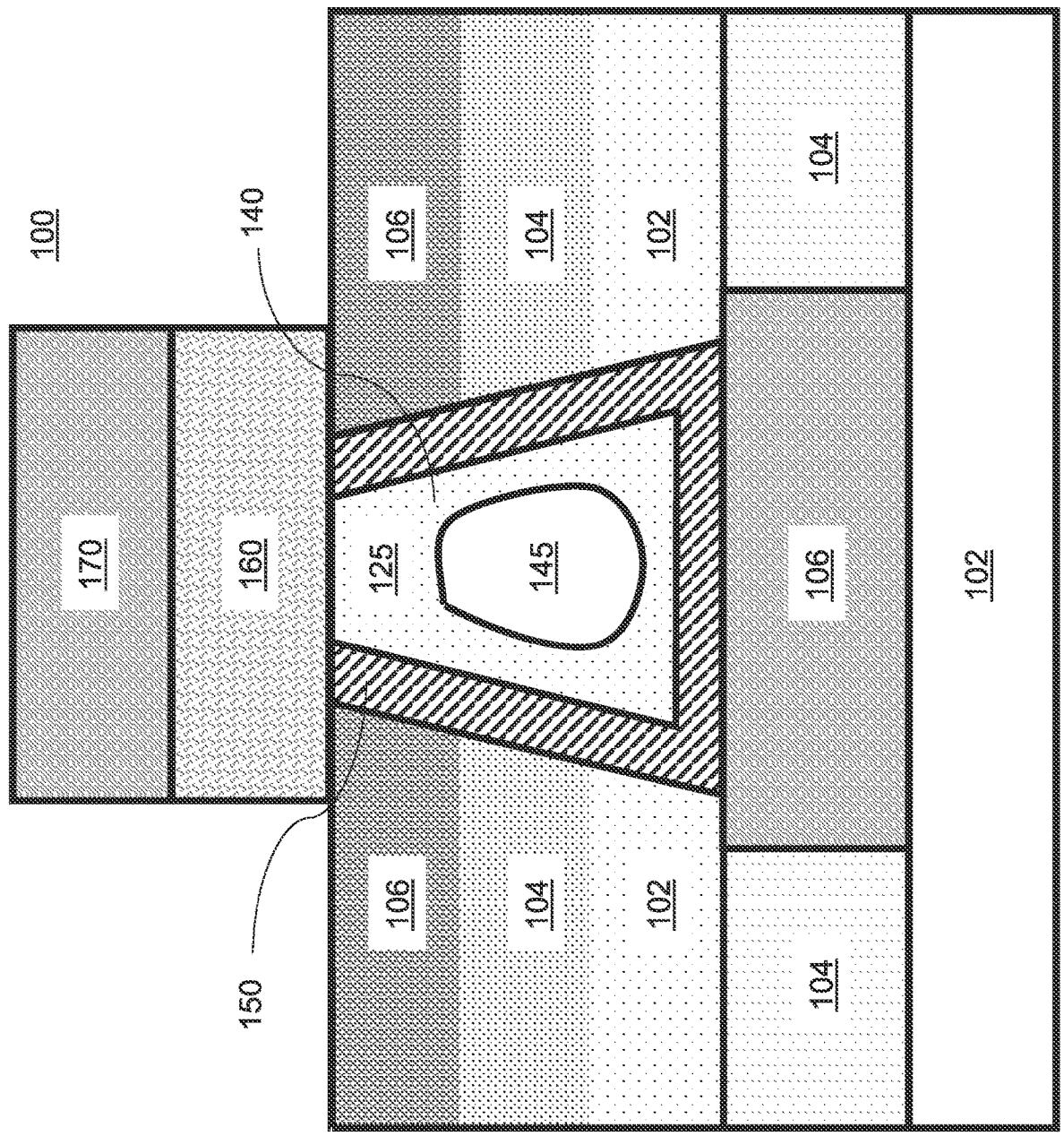
FIG. 4 is cross-sectional view of the formation of a ring heater from the heater material layer and further processing of the memory device during the fabrication of the semiconductor device, in accordance with an embodiment of the present invention.

With reference to FIG. 4, a planarization process (e.g., chemical-mechanical planarization (CMP)) is performed to remove portions of the heater material layer 130 and the dielectric material 140 above the dielectric material 110 to form a ring heater 150, a phase-change material layer 160 is formed on the dielectric materials 110 and 140 and the ring heater 150, and a top electrode 170 is formed on the phase-change material layer 150. The phase-change material layer 160 and the top electrode 170 can be formed using any suitable processes in accordance with the embodiments described herein.

The phase-change material layer 160 can include any suitable material in accordance with the embodiments described herein. Examples of suitable materials that can be used to form the phase-change material layer 160 include, but are not limited to, Ge—Sb—Te (germanium-antimony-tellurium or "GST") alloys (e.g., $Ge_2Sb_2Te_5$), Si—Sb—Te (silicon-antimony-tellurium) alloys, Ga—Sb—Te (gallium-antimony-tellurium) alloys, Ge—Bi—Te (germanium-bismuth-tellurium) alloys, In—Te (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Sb—Te alloys (e.g., $Sb_2Te_3$), Ge—Te alloy, and/or Si—Sb alloys. In some embodiments, the phase-change material layer 160 can further include nitrogen, carbon, and/or oxygen. In some embodiments, the phase-change material layer 160 can be doped with dielectric materials including, but not limited to, aluminum oxide ($Al_2O_3$), silicon dioxide ($SiO_2$), tantalum oxide ($Ta_2O_5$), hafnium oxide ($HfO_2$), zirconium oxide ($ZrO_2$), cerium oxide ($CeO_2$), silicon nitride (SiN), and/or silicon oxynitride (SiON).

The top electrode 170 can include any suitable conductive material in accordance with the embodiments described herein. Examples of suitable conductive materials that the top electrode 170 can be formed from include, but are not limited to, tungsten (W), copper (Cu), cobalt (Co), ruthenium (Ru), etc. In one embodiment, the top electrode 170 can include the same material as the bottom electrode 106. In another embodiment, the top electrode 170 can include a different material than the bottom electrode 106.

In one embodiment, the phase-change material can be formed followed by the formation of the top electrode material. The phase-change material and the top electrode material can then patterned by using any suitable patterning technique, including but not limited to, lithography followed by etching, sidewall imaging transfer, etc.

The ring heater 150 has a (truncated) cone shape in this illustrative embodiment by virtue of the cone-shaped via 125. The resistance of the ring heater 150 can increase gradually from the bottom electrode 106 and reach a maximum resistance at the top portion of the ring heater 150 contacting the phase-change material layer 150. Accordingly, in combination with the air gap 145, the formation of the ring heater 150 depicted in FIGS. 1-4 can improve the memory device of the device 100 by reducing heat loss which wastes programming energy, and reducing programming currents during RESET.

In an alternative embodiment, as will be described in further detail below with reference to FIGS. 5-9, a ring heater can be formed having a staircase shape. However, both the cone and staircase shape embodiments are illustrative examples, and ring heaters having other suitable shapes can be realized in accordance with the embodiments described herein.

Figure 5:
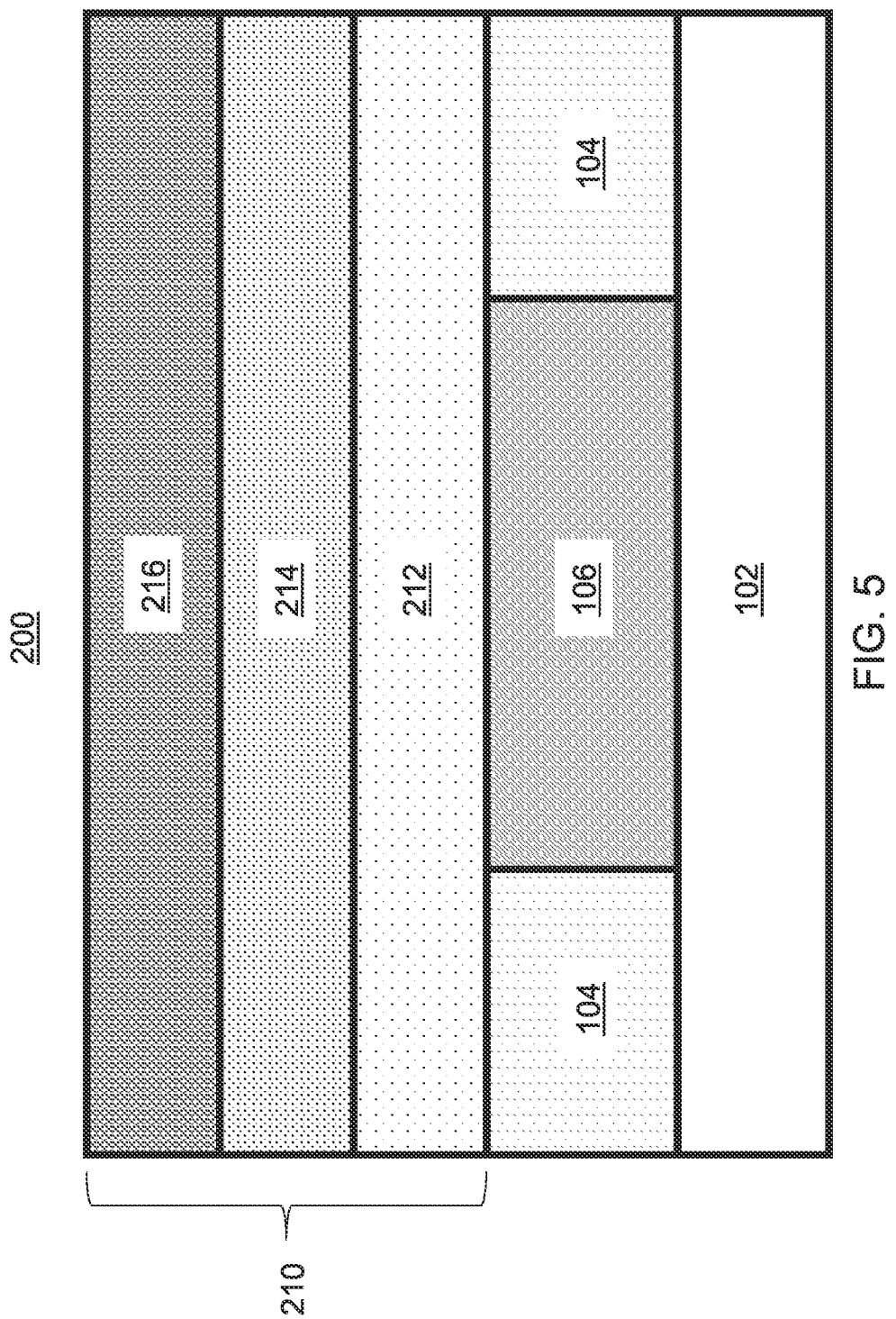
FIG. 5 is a cross-sectional view of the formation of first dielectric material during the fabrication of a semiconductor device, in accordance with another embodiment of the present invention.

With reference to FIG. 5, a semiconductor device 200 is shown. The device 200 includes a memory device. In one embodiment, the memory device includes a phase-change memory (PCM) device. However, such an embodiment should not be considered limiting.

As shown, the device 200 includes a substrate 102, and dielectric layer portions 104 adjacent to a bottom electrode 106 disposed on the substrate 102, as described above with reference to FIG. 1.

As further shown, the device includes a dielectric stack 210 formed across the dielectric layer portions 104 and the bottom electrode 106. The dielectric stack 210 can include a plurality of dielectric layers having different etch properties. For example, in this illustrative embodiment, the dielectric stack 210 can include three dielectric layers, dielectric layers 212 through 216, having different etch properties. For example, the dielectric layers 212 through 216 can have varying oxygen and nitrogen ratios (O:N), such that the dielectric layer 212 can be N-rich and the dielectric layer 216 can be O-rich. In one embodiment, the dielectric layer 212 can include, e.g., silicon oxide (e.g., $SiO_2$), the dielectric layer 214 can include, e.g., silicon oxynitride (SiON), and the dielectric layer 216 can include, e.g., silicon nitride (e.g., SiN). However, such an embodiment should not be considered limiting.

Figure 6:
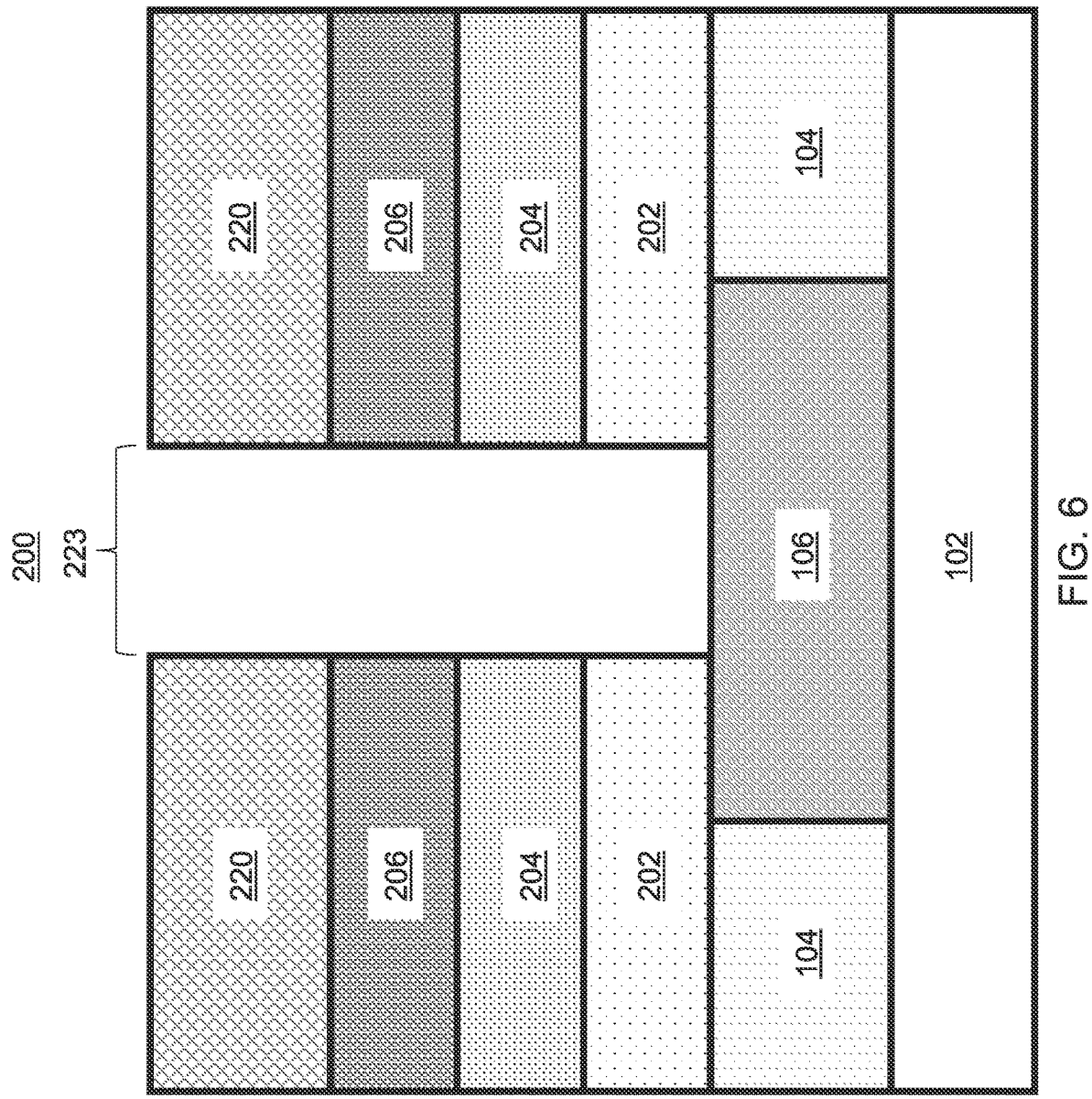
FIG. 6 is a cross-sectional view of the formation of an opening of the first dielectric material during the fabrication of the semiconductor device, in accordance with another embodiment of the present invention.

With reference to FIG. 6, mask layers 220 are formed on the dielectric material 210 to form an opening 223. The opening 223 can be formed by employing a first etch process to remove the dielectric material 210 to the bottom electrode 106 (e.g., using RIE or other suitable dry etch process).

Figure 7:
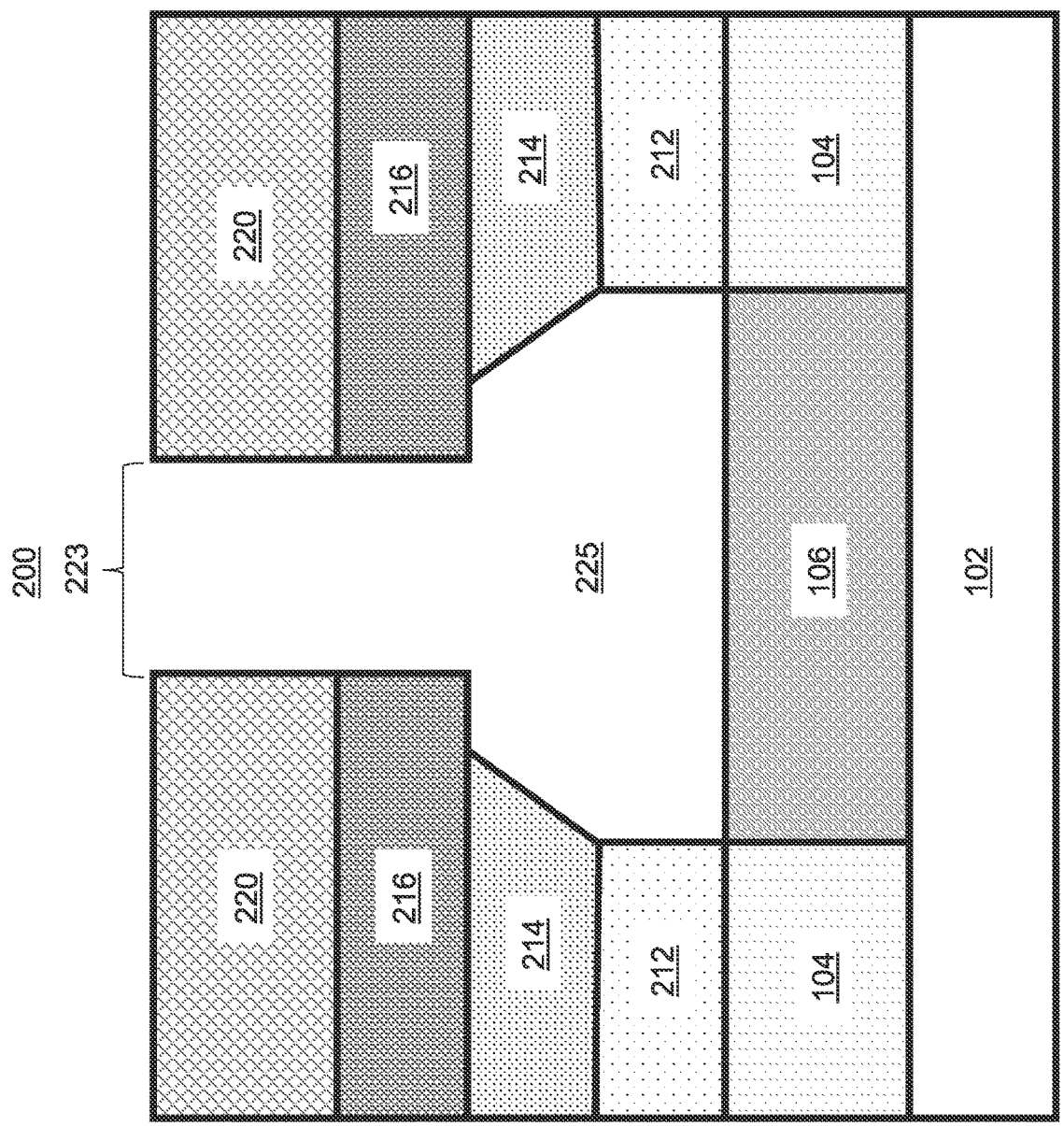
FIG. 7 is a cross-sectional view of the formation of a via within the opening during the fabrication of the semiconductor device, in accordance with another embodiment of the present invention.

With reference to FIG. 7, a via 225 is formed within the opening 223. As shown in this illustrative embodiment, the via 225 has a staircase shape. The via 225 can be formed by using a second etch process (e.g., an isotropic etch process) within the opening 223 to form the staircase shape. More specifically, the staircase shape can be formed by exploiting the etch rate variations of the dielectric layers 212 through 216. For example, the dielectric layer 212 (e.g., silicon oxide) can be etched faster than the dielectric layer 214 (e.g. silicon oxynitride), and the dielectric layer 214 (e.g. silicon oxynitride) can be etched faster than the dielectric layer 216 (e.g., silicon nitride). The bottom of the dielectric layer 214 next to the dielectric layer 212 can be etched, resulting in a sloped profile.

Figure 8:
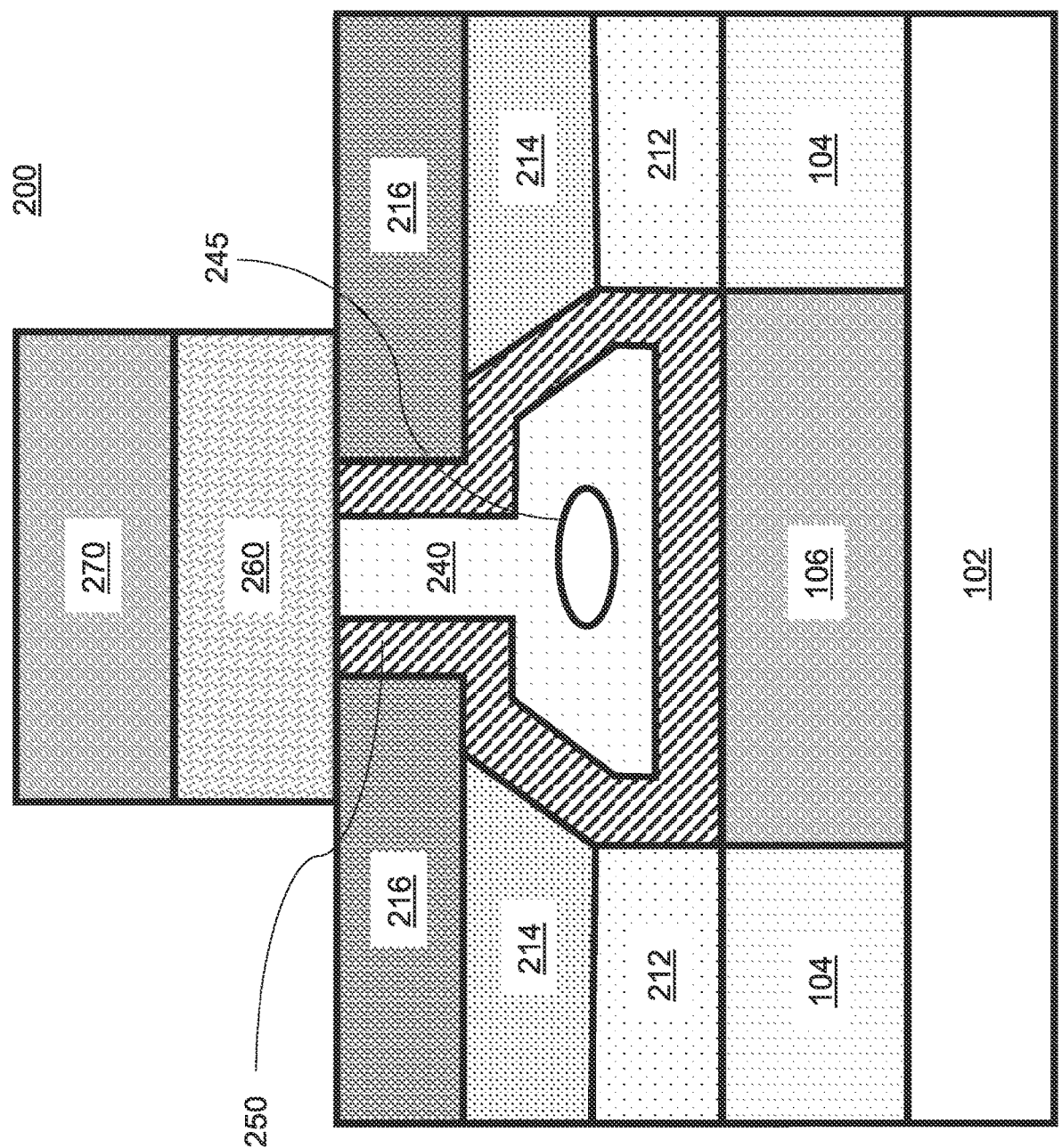
FIG. 8 is cross-sectional view of the formation of a ring heater from a heater material layer and further processing of the memory device during the fabrication of the semiconductor device, in accordance with another embodiment of the present invention.

With reference to FIG. 8, the mask layers 220 are removed, a heater material layer 230 is conformally deposited along exposed surfaces of the dielectric material 210 (e.g., using atomic layer deposition (ALD)) and the bottom electrode 106, dielectric material 240 is formed on the heater material layer 230 and within the via 225, a planarization process (e.g., chemical-mechanical planarization (CMP)) is performed to remove portions of the heater material layer 230 and the dielectric material 240 above the dielectric material 210 to form a ring heater 250, a phase-change material layer 260 is formed on the dielectric materials 210 and 240 and the ring heater 250, and a top electrode 270 is formed on the phase-change material layer 250. Any suitable processes can be used to form the heater material layer 230 and the dielectric material 240 in accordance with the embodiments described herein.

The heater material layer 230 can include any suitable material in accordance with the embodiments described herein. Examples of suitable materials that can be used to form the heater material layer 230 include, but are not limited to, tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), tantalum magnesium carbide (TaMgC), titanium aluminum nitride (TiAlN), hafnium nitride (HfN), hafnium silicon nitride (HfSiN), tantalum silicon nitride (TaSiN), tungsten nitride (WN), molybdenum nitride (MoN), niobium nitride (NbN); titanium carbide (TiC) titanium aluminum carbide (TiAlC), tantalum carbide (TaC), hafnium carbide (HfC), conductive carbon, or any suitable combination of these materials. In some embodiments, a single conductive material can be used. In other embodiments, multiple conductive materials can be used.

The heater material layer 230 can be formed by any suitable process or any suitable combination of multiple processes. Examples of suitable processes that can be used to form the heater material layer 230 include, but are not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc. In one embodiment, the heater material layer 230 can have a thickness ranging from, e.g., about 4 nm to about 30 nm. More specifically, the heater material layer 230 can have a thickness of, e.g., about 6 nm.

The dielectric material 240 can include any suitable material in accordance with the embodiments described herein. Examples of suitable materials that can be used to form the dielectric material 240 include, but are not limited to, silicon nitride (SiN), silicon carbide (SiC), silicon oxynitride (SiON), carbon-doped silicon oxide (SiOC), silicon carbonitride (SiCN), boron nitride (BN), silicon boron nitride (SiBN), silicoboron carbonitride (SiBCN), silicon oxycarbonitride (SiOCN), silicon oxide, etc.

In some embodiments, and as further shown, the dielectric material 240 pinches off at the top of the via 225 (e.g., using CVD), thereby naturally forming an air gap 245 in the lower portion of the via 125. The air gap 245 can reduce thermal or heat loss associated with the device 200. In other embodiments, the remainder of the via 225 can be completely filled by the dielectric material 240 such as by $SiO_2$ deposited by spin-on-coating, flowable oxide, etc. In some embodiment, the remainder of the via 225 can be filled by deposition of a dielectric, etching back of the deposited dielectric, and deposition of the same or different dielectric. The deposition/etching back can be repeated multiple times (e.g., cyclic processing).

The phase-change material layer 260 and the top electrode 270 can be formed using any suitable processes in accordance with the embodiments described herein. Examples of suitable materials that can be used to form the phase-change material layer 260 include, but are not limited to, Ge—Sb—Te (germanium-antimony-tellurium or "GST") alloys (e.g., $Ge_2Sb_2Te_5$), Si—Sb—Te (silicon-antimony-tellurium) alloys, Ga—Sb—Te (gallium-antimony-tellurium) alloys, Ge—Bi—Te (germanium-bismuth-tellurium) alloys, In—Te (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Sb—Te alloys (e.g., $Sb_2Te_3$), Ge—Te alloy, and/or Si—Sb alloys. In some embodiments, the phase-change material layer 260 can further include nitrogen, carbon, and/or oxygen. In some embodiments, the phase-change material layer 260 can be doped with dielectric materials including, but not limited to, aluminum oxide ($Al_2O_3$), silicon dioxide ($SiO_2$), tantalum oxide ($Ta_2O_5$), hafnium oxide ($HfO_2$), zirconium oxide ($ZrO_2$), cerium oxide ($CeO_2$), silicon nitride (SiN), and/or silicon oxynitride (SiON).

The top electrode 270 can include any suitable conductive material in accordance with the embodiments described herein. Examples of suitable conductive materials that the top electrode 270 can be formed from include, but are not limited to, tungsten (W), copper (Cu), cobalt (Co), ruthenium (Ru), etc. In one embodiment, the top electrode 270 can include the same material as the bottom electrode 106. In another embodiment, the top electrode 270 can include a different material than the bottom electrode 106.

In one embodiment, the phase-change material can be formed followed by the formation of the top electrode material. The phase-change material and the top electrode material can then patterned by using any suitable patterning technique, including but not limited to, lithography followed by etching, sidewall imaging transfer, etc.

The ring heater 250 has a staircase shape in this illustrative embodiment by virtue of the staircase-shaped via. The resistance of the ring heater 250 can increase gradually from the bottom electrode 106 and reach a maximum resistance at the top portion of the ring heater 250 contacting the phase-change material layer 260. Accordingly, in combination with the air gap 245, the formation of the ring heater 250 depicted in FIGS. 5-9 can improve the memory device of the device 200 by reducing heat loss which wastes programming energy, and reducing programming currents during RESET.

Although a cone-shaped ring heater and staircase-shaped heater have been described above with reference to FIGS. 1-8, the ring heater can have any geometry that can increase heater resistance from the bottom electrode to the top of the heater. For example, a heater material formed in a via with a narrower opening at the top of the via and a wider opening at the bottom of the via can produce higher heater resistance at the top of the heater and lower resistance at the bottom of the heater. Although not shown, other suitable techniques that can improve PCM device characteristics can be incorporated in accordance with the embodiments described herein.

Figure 9:
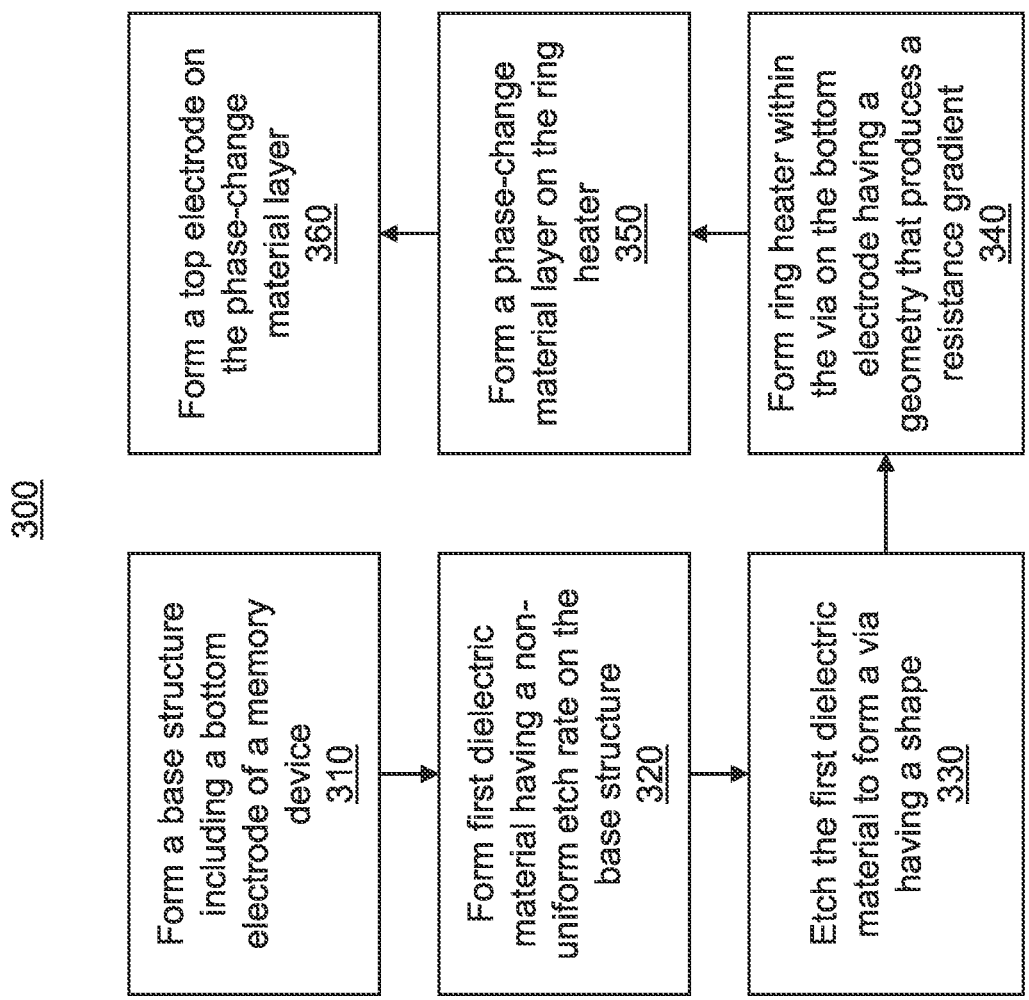
FIG. 9 is a block/flow diagram showing a method for forming a semiconductor device, in accordance with an embodiment of the present invention.

With reference to FIG. 9, a block/flow diagram is provided illustrating a system/method 300 for fabricating a semiconductor device. The semiconductor device can include a memory device (e.g., a PCM device).

At block 310, a base structure including a bottom electrode of a memory device is formed. The base structure can include a substrate, dielectric layer portions formed on the substrate, and the bottom electrode formed between the dielectric layer portions. Forming the base structure can include forming a dielectric layer over the substrate, etching the dielectric layer to form the dielectric portions separated by an opening or a trench, and forming conductive material with the opening to form the bottom electrode. The substrate can include, e.g., pre-built devices.

At block 320, first dielectric material having a non-uniform etch rate is formed on the base structure. As will be described in further detail below, the non-uniform etch rate can enable the formation of a ring heater having a geometry that produces a resistance gradient across the ring heater.

In one embodiment, forming the first dielectric material can include forming a single dielectric layer having an etch rate gradient to enable the formation of a via having a cone shape within the first dielectric material. For example, the first dielectric material can be formed to include silicon oxynitride having an O:N gradient corresponding to an O-rich portion or end, and an N-rich portion or end. As will be described in further detail below, this embodiment can be used to form a cone-shape via from the first dielectric material In another embodiment, forming the first dielectric material can include forming a plurality of dielectric layers having different etch properties. Forming the dielectric stack can include forming a first dielectric layer having a first etch rate on the base structure, forming a second dielectric layer having a second etch rate on the first dielectric layer, and forming a third dielectric layer having a third etch rate on the second dielectric layer. For example, the dielectric layers can have varying oxygen and nitrogen ratios (O:N), such that the first dielectric layer can be N-rich and the third dielectric layer can be O-rich. In one embodiment, the first dielectric layer can include, e.g., silicon oxide (e.g., $SiO_2$), the second dielectric layer can include, e.g., silicon oxynitride (SiON), and the third dielectric layer can include, e.g., silicon nitride (e.g., SiN). However, such an embodiment should not be considered limiting. As will be described in further detail below, this embodiment can be used to form a staircase-shaped via from the first dielectric material.

Further details regarding blocks 310 and 320 are described above with reference to FIGS. 1-2 and 5.

At block 330, the first dielectric material is etched to form a via having a shape. The via can have any suitable shape in accordance with the embodiments described herein.

In the embodiment in which the first dielectric material includes a single dielectric layer having an etch rate gradient, the first dielectric material can be etched to form a via having a cone-shape. For example, etching the first dielectric material to form the via can include forming a mask on the first dielectric material, employing a first etch process to form an opening within the first dielectric material to the bottom electrode based on the mask, and employing a second etch process to form the cone shape within the opening. The first etch process can include, e.g., dry etching (e.g., RIE) and the second etch process can include, e.g., isotropic etching. In the embodiment in which the first dielectric material includes silicon oxynitride, a diluted hydrofluoric acid (DHF) etchant can be used during the second etch process to form the cone-shaped via. As another example, etching first dielectric material can include tuning a dry etch process to form a cone shape within an opening. For example, if the first dielectric material includes silicon oxynitride, a silicon oxynitride plasma etch process can be tuned such that it has a more lateral etch component on the N-rich end than on the O-rich end to form the via.

In the embodiment in which the first dielectric material includes a dielectric stack including a plurality of dielectric layers having different etch properties, the first dielectric material can be etched to form a via having a staircase shape. For example, forming the via can include forming a mask on the dielectric stack, employing a first etch process to form an opening within the dielectric stack to the bottom electrode based on the mask, and employing a second etch process to form the staircase shape within the opening. The first etch process can include dry etching and the second etch process can include isotropic etching. More specifically, the staircase shape can be formed by exploiting the etch rate variations of the dielectric layers of the dielectric stack. For example, the first dielectric layer (e.g., silicon oxide) can be etched faster than the second dielectric layer (e.g. silicon oxynitride), and the second dielectric layer (e.g. silicon oxynitride) can be etched faster than the third dielectric layer (e.g., silicon nitride). The bottom of the second dielectric layer next to the first dielectric layer can be etched, resulting in a sloped profile.

Further details regarding block 330 are described above with reference to FIGS. 2 and 6-7.

At block 340, a ring heater having a geometry that produces a resistance gradient is formed within the via on the bottom electrode. For example, the ring heater can be formed to have a geometry that produces a lower resistance at a bottom surface of the ring heater than at a top surface of the ring heater.

The geometry of the ring heater is based on the shape of the via formed within the first dielectric material. For example, the ring heater can have a cone shape based on the shape of the cone-shaped via, a staircase shape based on the shape of the staircase-shaped via, etc.

In one embodiment, forming the ring heater can include conformally depositing a heater material layer along exposed surfaces of the via, the bottom electrode and the first dielectric material using ALD, CVD, etc. In one embodiment, the heater material layer can be formed to have a thickness ranging from, e.g., about 4 nm to about 30 nm. More specifically, the heater material layer can be formed to have a thickness of, e.g., about 6 nm Then, a second dielectric material can formed on the heater material layer. In some embodiments, due to pinch off at the top of the via, the formation of the second dielectric material can result in the natural formation of an air gap in the lower portion of the via. The air gap can reduce thermal or heat loss associated with the device. The heater material layer and the second dielectric layer can be planarized (e.g., using chemical-mechanical planarization (CMP)) to remove portions of the heater material layer and the second dielectric material above the first dielectric material.

In another embodiment, forming the ring heater can include filling the via without the use of a second dielectric layer. In this embodiment, the heater material layer can pinch off at the top of the via, thereby forming an air gap in the lower portion of the via. The heater material layer can then be planarized (e.g., using CMP) to remove portions of the heater material layer above the first dielectric material.

At block 350, a phase-change material layer is formed on the ring heater and, at block 360, a top electrode is formed on the phase-change material layer. In one embodiment, the top electrode can include the same material as the bottom electrode. In another embodiment, the top electrode can include a different material than the bottom electrode.

Further details regarding blocks 340-360 are described above with reference to FIGS. 3-4 and 8.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
   etching first dielectric material having a non-uniform etch rate to form a via, the first dielectric material being formed on a base structure of a memory device and including a single layer having an etch rate gradient; and
   forming a ring heater within the via on a first electrode of the base structure, the ring heater having a geometry based on a shape of the via that produces a resistance gradient.

2. The method of claim 1, wherein the first dielectric material includes silicon oxynitride having an O:N gradient corresponding to an O-rich portion and an N-rich portion.

3. The method of claim 1, wherein etching the first dielectric material to form the via further includes employing at least one etch process to form a cone-shaped via within an opening within the first dielectric layer to the first electrode.

4. The method of claim 1, further comprising forming the first dielectric material to include a dielectric stack including a plurality of dielectric layers have different etch properties, including:
   forming, on the base structure, a first dielectric layer having a first etch rate;
   forming, on the first dielectric layer, a second dielectric layer having a second etch rate slower than the first etch rate; and
   forming, on the second dielectric layer, a third dielectric layer having a third etch rate slower than the second etch rate.

5. The method of claim 4, wherein:
   the first dielectric layer includes silicon oxide;
   the second dielectric layer includes silicon oxynitride; and
   the third dielectric layer includes silicon nitride.

6. The method of claim 4, wherein etching the first dielectric material to form the via further includes employing at least one etch process to form a staircase-shaped via within an opening within the dielectric stack to the first electrode.

7. The method of claim 1, wherein forming the ring heater further includes forming at least a heater material layer within the via, and planarizing to remove portions of at least the heater material layer above the first dielectric material.

8. The method of claim 1, wherein forming the ring heater further includes forming an air gap within the via that reduces thermal or heat loss associated with the memory device.

9. The method of claim 1, further comprising:
forming a phase-change material layer on the ring heater; and
forming a second electrode on the phase-change material layer.

10. A method for fabricating a semiconductor device, comprising:
forming first dielectric material having a non-uniform etch rate on a base structure of a memory device, the base structure including a first electrode and the first dielectric material including silicon oxynitride;
etching the first dielectric material to form a via;
forming a ring heater within the via on the first electrode, the ring heater having a geometry based on a shape of the via that produces a resistance gradient;
forming a phase-change material layer on the ring heater; and
forming a second electrode on the phase-change material layer.

11. The method of claim 10, further comprising forming the first dielectric material to include a single layer of silicon oxynitride having an O:N gradient corresponding to an O-rich portion and an N-rich portion, wherein etching the first dielectric material to form the via further includes employing at least one etch process to form a cone-shaped via within an opening within the first dielectric layer to the first electrode.

12. The method of claim 10, further comprising forming the first dielectric material to include a dielectric stack including a plurality of dielectric layers have different etch properties, including:
forming, on the base structure, a first dielectric layer including silicon oxide having a first etch rate;
forming, on the first dielectric layer, a second dielectric layer including silicon oxynitride having a second etch rate slower than the first etch rate; and
forming, on the second dielectric layer, a third dielectric layer including silicon nitride having a third etch rate slower than the second etch rate;
wherein etching the first dielectric material to form the via further includes employing at least one etch process to form a staircase-shaped via within an opening within the dielectric stack to the first electrode.

13. The method of claim 10, wherein forming the ring heater further includes forming at least a heater material layer within the via, and planarizing to remove portions of at least the heater material layer above the first dielectric material.

14. The method of claim 10, wherein forming the ring heater further includes forming an air gap within the via that reduces thermal or heat loss associated with the memory device.

15. A method for fabricating a semiconductor device, comprising:
forming first dielectric material having a non-uniform etch rate on a base structure of a memory device, the base structure including a first electrode and the first dielectric material including silicon oxynitride;
etching the first dielectric material to form a via; and
forming a ring heater within the via on the first electrode, the ring heater having a geometry based on a shape of the via that produces a resistance gradient.

16. The method of claim 15, further comprising:
forming a phase-change material layer on the ring heater; and
forming a second electrode on the phase-change material layer.

17. The method of claim 15, wherein forming the ring heater further includes forming at least a heater material layer within the via, and planarizing to remove portions of at least the heater material layer above the first dielectric material.

18. The method of claim 15, further comprising forming the first dielectric material to include a single layer of silicon oxynitride having an O:N gradient corresponding to an O-rich portion and an N-rich portion, wherein etching the first dielectric material to form the via further includes employing at least one etch process to form a cone-shaped via within an opening within the first dielectric layer to the first electrode.

19. The method of claim 15, further comprising forming the first dielectric material to include a single layer having an etch rate gradient.

* * * * *